(12) United States Patent
Gu

(10) Patent No.: US 11,695,394 B2
(45) Date of Patent: Jul. 4, 2023

(54) DATA SYNTHESIZER

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/658,772

(22) Filed: Apr. 11, 2022

(65) Prior Publication Data

US 2023/0122196 A1 Apr. 20, 2023

(30) Foreign Application Priority Data

Oct. 15, 2021 (CN) .......................... 202111202842.1

(51) Int. Cl.
 *H03K 3/037* (2006.01)
 *H03K 3/57* (2006.01)
 *G11C 11/4076* (2006.01)
 *G11C 11/4093* (2006.01)

(52) U.S. Cl.
 CPC ............. *H03K 3/0375* (2013.01); *H03K 3/57* (2013.01); *G11C 11/4076* (2013.01); *G11C 11/4093* (2013.01)

(58) Field of Classification Search
 CPC ................. H03K 3/0375; H03K 3/57
 See application file for complete search history.

(56) References Cited

U.S. PATENT DOCUMENTS

| | | | | |
|---|---|---|---|---|
| 7,061,941 B1* | 6/2006 | Zheng | .................. | G11C 7/1093 365/230.02 |
| 9,160,520 B1* | 10/2015 | Hwang | .................. | G11C 7/222 |
| 2007/0109882 A1* | 5/2007 | Taniguchi | ............ | G11C 29/789 365/200 |
| 2008/0129561 A1* | 6/2008 | Shim | ...................... | H03K 5/135 341/101 |
| 2010/0309958 A1* | 12/2010 | Lakkis | ................ | H04J 13/0003 375/150 |
| 2011/0157251 A1* | 6/2011 | Lim | ............... | H03K 19/018521 345/212 |

FOREIGN PATENT DOCUMENTS

CN 110310684 A 10/2019

\* cited by examiner

*Primary Examiner* — Sibin Chen
(74) *Attorney, Agent, or Firm* — Syncoda LLC; Feng Ma

(57) ABSTRACT

A data synthesizer includes a first input circuit, a second input circuit, and an output circuit. The first input circuit is configured to latch a first data under control of a first latch clock signal. The second input circuit is configured to latch a second data under control of the first latch clock signal. A phase of the first data is the same as a phase of the second data. The output circuit is connected to the first input circuit and the second input circuit. The output circuit is configured to output the first data and the second data in sequence.

14 Claims, 6 Drawing Sheets

DATA SYNTHESIZER

CROSS-REFERENCE TO RELATED APPLICATION

This application claims priority to Chinese Patent Application No. 202111202842.1 filed on Oct. 15, 2021, the disclosure of which is hereby incorporated by reference in its entirety.

BACKGROUND

At present, dynamic random access memory (DRAM) technology develops rapidly. Generally, synchronous dynamic random access memory (SDRAM), the second generation double data rate (DDR2) SDRAM, the third generation double data rate (DDR3) SDRAM, the fourth generation double data rate (DDR4) SDRAM, the fifth generation double data rate (DDR5) SDRAM and/or the like are used.

SUMMARY

The present disclosure relates to the field of semiconductor technologies and provides a data synthesizer. The data synthesizer may include a first input circuit, a second input circuit, and an output circuit.

The first input circuit is configured to latch first data under control of a first latch clock signal.

The second input circuit is configured to latch second data under the control of the first latch clock signal. A phase of the first data is the same as a phase of the second data.

The output circuit is connected to the first input circuit and the second input circuit. The output circuit is configured to output the first data and the second data in sequence.

BRIEF DESCRIPTION OF THE DRAWINGS

The accompanying drawings, which are incorporated in and constitute a part of the specification, illustrate embodiments in accordance with the present disclosure and together with the specification, serve to explain the principles of the present disclosure.

Figure 1:
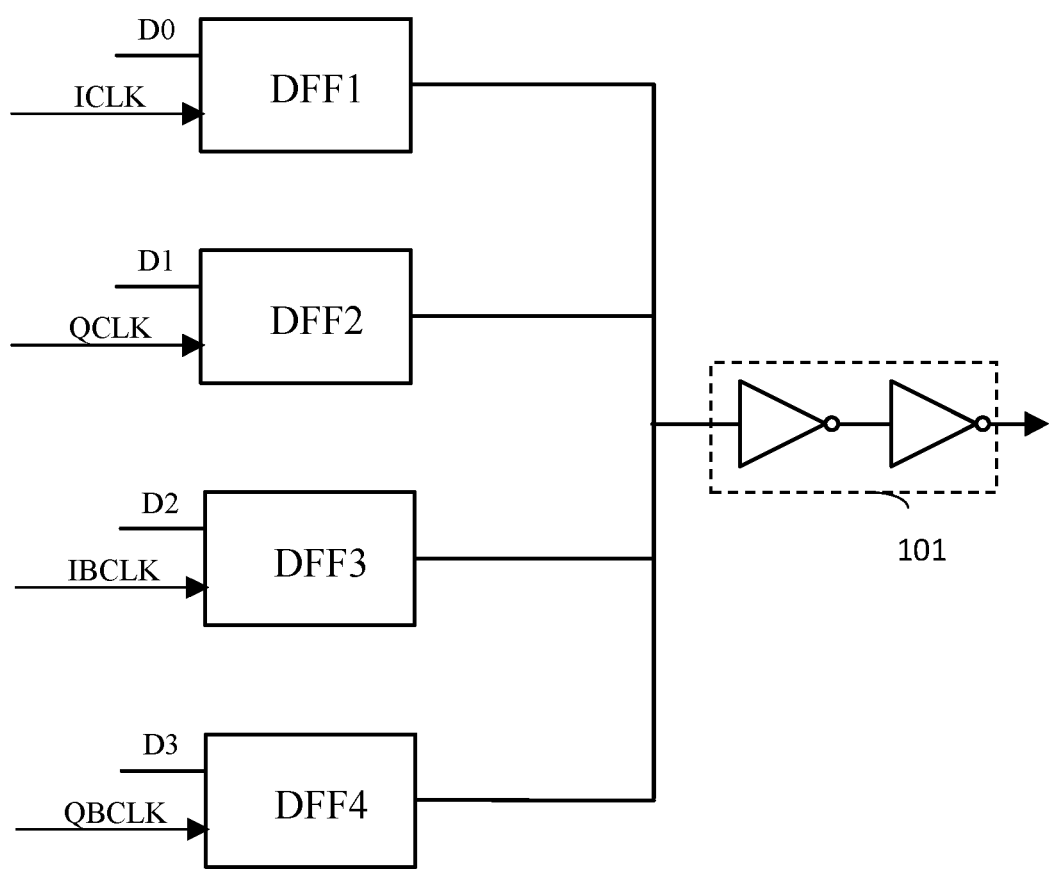
FIG. 1 is a schematic circuit diagram of a data synthesizer according to an embodiment of the present disclosure.

The specific embodiments of the present disclosure have been illustrated by the above drawings and will be described in more detail in the following descriptions. These drawings and descriptions are not intended to limit the scope of the concepts of the present disclosure in any way, but rather to explain the concepts of the present disclosure to those skilled in the art by reference to certain embodiments.

DETAILED DESCRIPTION

Exemplary embodiments will be described in detail herein, examples of which are illustrated in the drawings. When the following description relates to the accompanying drawings, the same numerals in different drawings denote the same or similar elements unless otherwise indicated. The embodiments described in the following exemplary embodiments do not represent all embodiments consistent with the present disclosure. Rather, the embodiments described in the following exemplary embodiments are merely examples of apparatuses and methods consistent with some aspects of the present disclosure as detailed in the appended claims.

At present, when the DDR5 operates, the speed of the interface portion reaches the maximum speed, e.g., 6400 Mbps, but the internal operating speed of the DDR5 is only half of the speed of interface portion, e.g., 3200 Mbps. Therefore, when the DDR5 outputs data, the data transmitter (TX) needs to synthesize four channels of low-speed data into one channel of high-speed data. In such a case, a data synthesizer is usually provided in the data transmitter to achieve data synthesis. For the integrity of the output data, the best setup time and hold time may be required for each channel of data when synthesizing the data.

As illustrated in FIG. 1, a data synthesizer according to an embodiment of the present disclosure includes four data flip-flops (DFF for short) and a drive circuit 101.

Four data flip-flops are sequentially marked as a first data flip-flop DFF1, a second data flip-flop DFF2, a third data flip-flop DFF3, and a fourth data flip-flop DFF4. Output terminals of the four data flip-flops are all connected to an input terminal of the drive circuit 101. Each data flip-flop is configured to latch input data under control of a clock signal corresponding to the data flip-flop. The clock signals of the four data flip-flops are different in phase so that the four data flip-flops perform respective outputs to the drive circuit 101 in sequence, thereby realizing the synthesis of four channels of data into one channel of data. The drive circuit 101 includes two inverters that are cascaded, so as to implement enhancement processing of the synthesized data.

Figure 2:
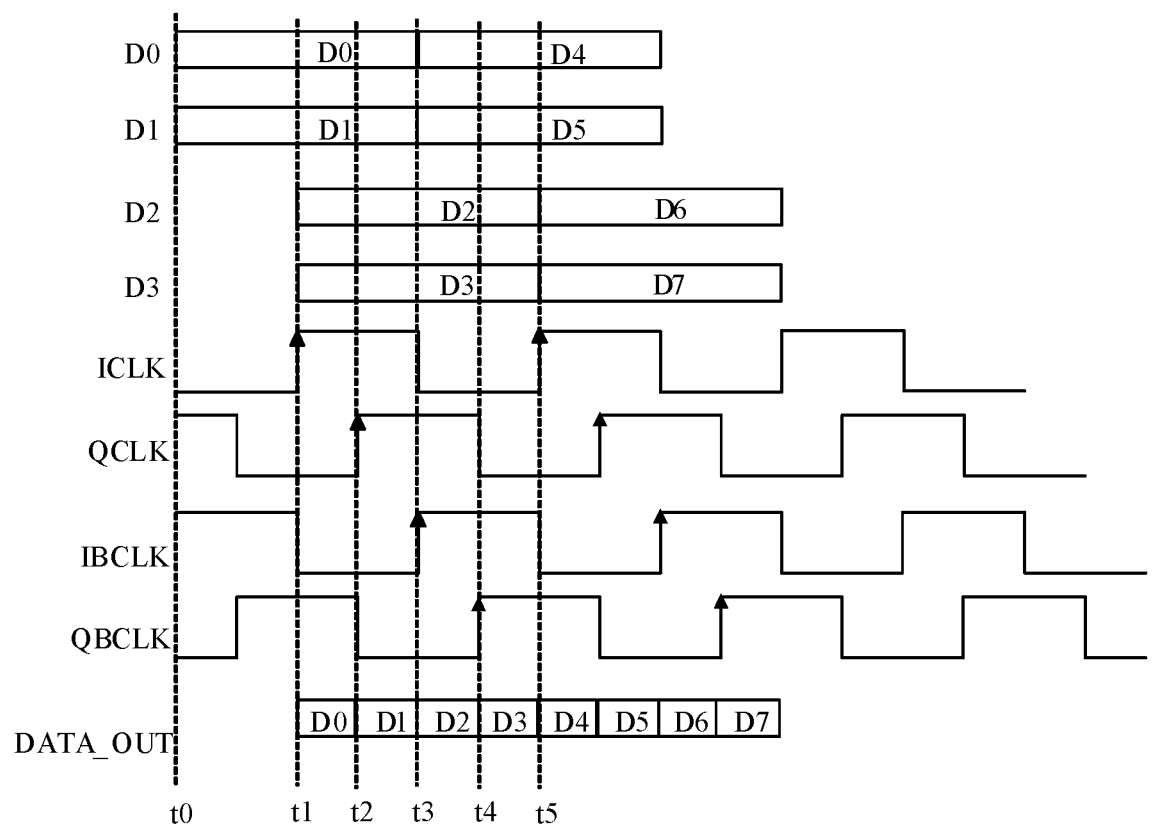
FIG. 2 is a timing diagram of the data synthesizer provided in the embodiment illustrated in FIG. 1.

Referring to FIG. 1 and FIG. 2, the data received at an input terminal of the first data flip-flop DFF1 is the first data D0, and a clock signal of the first data flip-flop DFF1 is marked as the first latch clock signal ICLK. The data received at an input terminal of the second data flip-flop DFF2 is the second data D1, and a clock signal of the second data flip-flop DFF2 is marked as the third latch clock signal QCLK. The data received at an input terminal of the third data flip-flop DFF3 is the third data D2, and a clock signal of the third data flip-flop DFF3 is marked as the second latch clock signal IBCLK. The data received at an input terminal of the fourth data flip-flop DFF4 is the fourth data D3, and a clock signal of the fourth data flip-flop DFF4 is marked as the fourth latch clock signal QBCLK.

A phase of the first latch clock signal ICLK is ahead of a phase of the third latch clock signal QCLK by 90°, the phase of the first latch clock signal ICLK is ahead of a phase of the second latch clock signal IBCLK by 180°, and the phase of the second latch clock signal IBCLK is ahead of a phase of the fourth latch clock signal QBCLK by 90°.

A phase of the first data D0 is the same as a phase of the second data D1, and a phase of the third data D2 is the same as a phase of the fourth data D3. The rising edge time t1 of the first latch clock signal ICLK is the same as the arrival time t1 of the third data D2.

The operation principle of the data synthesizer illustrated in FIG. 1 will be described below in conjunction with FIG. 2.

At time t0, the first data D0 arrives and is held until time t3, and the first data flip-flop DFF1 latches the first data D0.

At time t0, the second data D1 arrives and is held until time t3, and the second data flip-flop DFF2 latches the second data D1.

At time t1, that is, after the phases of the first data D0 and the second data D1 are delayed by 180°, the third data D2 arrives and is held until time t5, and the third data flip-flop DFF3 latches the third data D2. At time t1, the fourth data D3 arrives and is held until time t5, and the fourth data flip-flop DFF4 latches the fourth data D3. At this time (i.e., time t1), the first latch clock signal ICLK arrives at first, and the first data flip-flop DFF1 releases the first data D0.

At time t2, that is, after the phase of the first latch clock signal ICLK is delayed by 90°, the third latch clock signal QCLK arrives and the second data flip-flop DFF2 releases the second data D1.

At time t3, that is, after the phase of the first latch clock signal ICLK is delayed by 180°, the second latch clock signal IBCLK arrives and the third data flip-flop DFF3 releases the third data D2.

At time t4, that is, after the phase the second latch clock signal IBCLK is delayed by 90°, the fourth latch clock signal QBCLK arrives and the fourth data flip-flop DFF4 releases the fourth data D3.

According to the above-described timing relationship, the output terminal DATA_OUT of the data synthesizer outputs the first data D0, the second data D1, the third data D2, and the fourth data D3 in sequence, thereby synthesizing four channels of data into one channel of data for outputting.

The synthesis process of the fifth data D4, the sixth data D5, the seventh data D6, and the eighth data D7 is the same as the synthesis process of the first data D0, the second data D1, the third data D2, and the fourth data D3, and thus is not repeated herein.

In the above technical solution, the first data D0, the second data D1, the third data D2, and the fourth data D3 are sequentially outputted by using four latch clock signals having different phases, so that four channels of data are synthesized into one channel of data for outputting.

With continued reference to FIG. 2, the phase of the first data D0 is the same as the phase of the second data D1, and the phase of the third data D2 is the same as the phase of the fourth data D3. Since the phases of two channels of data are the same, the case that a rising edge of each of the four latch clock signals having different phases is located at a middle time of a hold time period of a respective one of the four channels of data cannot be ensured during the data latching process. If a jitter occurs at the phase of the latch clock signal or the phase of the data and the jitter is relatively large, there will be the problem that the corresponding data cannot be accurately output. For example, if the phase of the third latch clock signal QCLK is delayed, there will be a situation that the third latch clock signal QCLK still does not arrive after the hold time of the second data D1 ends, so that the second data D1 cannot be output, or there will be a situation that the output terminal of the second data flip-flop sets up the second data D1 at a later setup time and the second data D1 has a shorter hold time, so that the accuracy of data synthesis is reduced.

Figure 3:
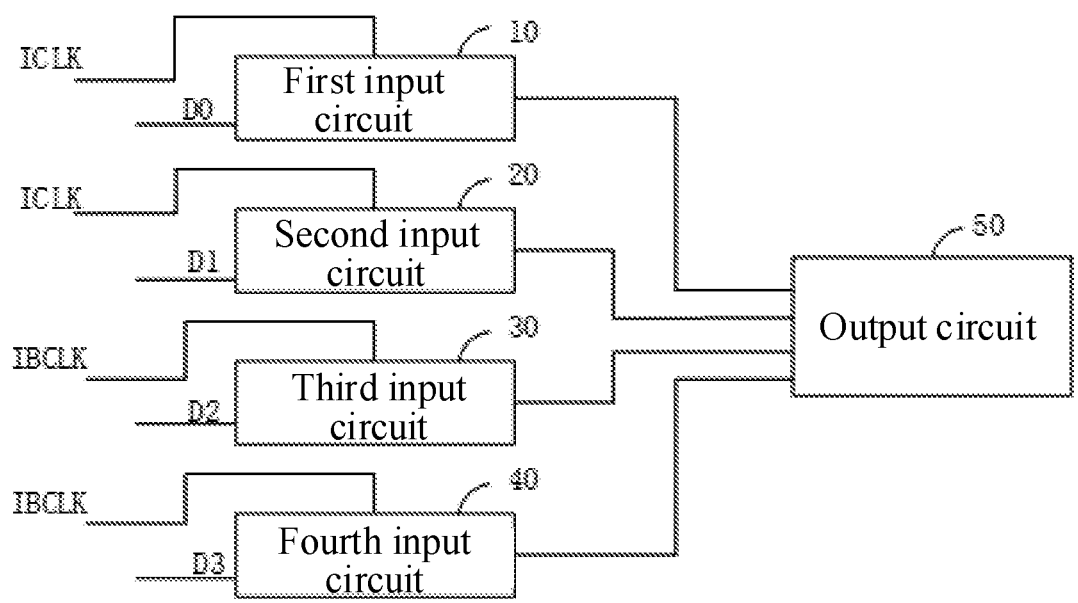
FIG. 3 is a schematic circuit diagram of a data synthesizer according to another embodiment of the present disclosure.

As illustrated in FIG. 3, an embodiment of the present disclosure provides a data synthesizer. The data synthesizer includes a first input circuit 10, a second input circuit 20, and an output circuit 50. The first input circuit 10 is connected to the output circuit 50, and the second input circuit 20 is connected to the output circuit 50.

An input terminal of the first input circuit 10 receives first data D0, an input terminal of the second input circuit 20 receives second data D1, and a phase of the first data D0 is the same as a phase of the second data D1. The first input circuit 10 is configured to latch the first data D0 under control of a first latch clock signal ICLK. The second input circuit 20 is configured to latch the second data D1 under the control of the first latch clock signal ICLK. The output circuit 50 is configured to output the first data D0 and the second data D1 in sequence.

The first data D0 and the second data D1 arrive at the same time and arrive earlier than the arrival of the first latch clock signal ICLK. When the first latch clock signal ICLK arrives, an output terminal of the first input circuit 10 outputs the first data D0, and at the same time, an output terminal of the second input circuit 20 outputs the second data D1. After receiving the first data D0 and the second data D1, the output circuit 50 outputs the first data D0 and the second data D1 in sequence by controlling output timing of the first data D0 and the second data D1.

In the above-described technical solution, for the first data D0 and the second data D1 having the same phase, the first input circuit 10 and the second input circuit 20 use the same latch clock signal. By having the first latch clock signal ICLK located within a middle time period of a hold time period of the first data D0 and within a middle time period of a hold time period of the second data D1 (for example, if the hold time period is from the first second to the sixth second, the middle time period is from the third second to the fourth second), even when there is a large fluctuation in the phase of the first latch clock signal ICLK, or there is a large fluctuation in any one or both of the phase of the first data D0 and the phase of the second data D1, it can still be ensured that a time corresponding to a rising edge of the first latch clock signal ICLK is within the hold time period of the first data D0 and within the hold time period of the second data D1, so that the first input circuit 10 sets up the first data D0 at the output terminal of the first input circuit as early as possible and the second input circuit 20 sets up the second data D1 at the output terminal of the second input terminal as early as possible, thereby ensuring that each channel of data in the synthesized data has the earliest setup time and the maximum hold time. Then, the output circuit 50 synthesizes two channels of data into one channel of data, thereby improving the data synthesis accuracy of the data synthesizer.

In an embodiment, with continued reference to FIG. 3, the data synthesizer further includes a third input circuit 30 and a fourth input circuit 40. The third input circuit 30 is connected to the output circuit 50 and the fourth input circuit 40 is connected to the output circuit 50. An input terminal of the third input circuit 30 receives third data D2, an input terminal of the fourth input circuit 40 receives fourth data D3, and a phase of the third data D2 is the same as a phase of the fourth data D3. The phase of the first data D0 is ahead of the phase of the third data D2.

The third input circuit 30 is configured to latch the third data D2 under control of a second latch clock signal IBCLK, and the fourth input circuit 40 is configured to latch the fourth data D3 under the control of the second latch clock signal IBCLK. The output circuit 50 is configured to output the first data D0, the second data D1, the third data D2, and the fourth data D3 in sequence.

The first data D0 and the second data D1 arrives at the same time, and when the first latch clock signal ICLK arrives, the first input circuit 10 outputs the first data D0, and simultaneously, the second input circuit 20 outputs the second data D1. After the first data D0 and the second data D1 arrive, the third data D2 and the fourth data D3 arrive at the same time, and the third data D2 and the fourth data D3 arrive earlier than the arrival of the second latch clock signal IBCLK. When the second latch clock signal IBCLK arrives, the third input circuit 30 outputs the third data D2, and simultaneously, the fourth input circuit 40 outputs the fourth data D3. The output circuit 50 first receives the first data D0 and the second data D1, then receives the third data D2 and the fourth data D3, and then outputs the first data D0, the second data D1, the third data D2, and the fourth data D3 in sequence by controlling the output timing of the first data D0, the second data D1, the third data D2, and the fourth data D3.

In the above technical solution, the phase of the first data D0 is the same as the phase of the second data D1, the phase of the third data D2 is the same as the phase of the fourth data D3, and the phase of the first data D0 differs from the phase of the third data D2. Allowing that the first input circuit 10 and the second input circuit 20 use the same latch clock signal, and the third input circuit 30 and the fourth input circuit 40 use the same latch clock signal. By having the first latching clock signal ICLK located within a middle time period of the hold time period of the first data D0 and having the second latching clock signal IBCLK located within a middle time period of the hold time period of the third data D2, even when there is a large fluctuation in the phase of the data or the latch clock signal, it can still be ensured that a time corresponding to a rising edge of the latch clock signal is within the hold time period of the corresponding data, so that the corresponding data can be set up at the output terminal of each input circuit as early as possible, thereby ensuring that each channel of data in the synthesized data has the earliest setup time and the maximum hold time; and that the corresponding input circuit can output data accurately, so as to realize synthesis of four channels of data for outputting, thereby improving the data synthesis accuracy of the data synthesizer.

In an embodiment, the phase of the first data D0 is ahead of the phase of the third data D2 by 180°, the phase of the first latch clock signal ICLK is ahead of the phase of the second latch clock signal IBCLK by 180°, and a time corresponding to a rising edge of the first latch clock signal is the same as a time at which the third data is set up at the input terminal of the third input circuit. With such a configuration, the rising edge time of the first latch clock signal ICLK coincides with a middle time of the hold time period of the first data D0, and the rising edge time of the second latch clock signal IBCLK coincides with a middle time of the hold time period of the third data D2. Therefore, it can be ensured that the respective data is set up at the output terminals of the four input circuits at an earlier setup time and the respective data has a longer hold time, thereby improving the accuracy of data synthesis.

Figure 4:
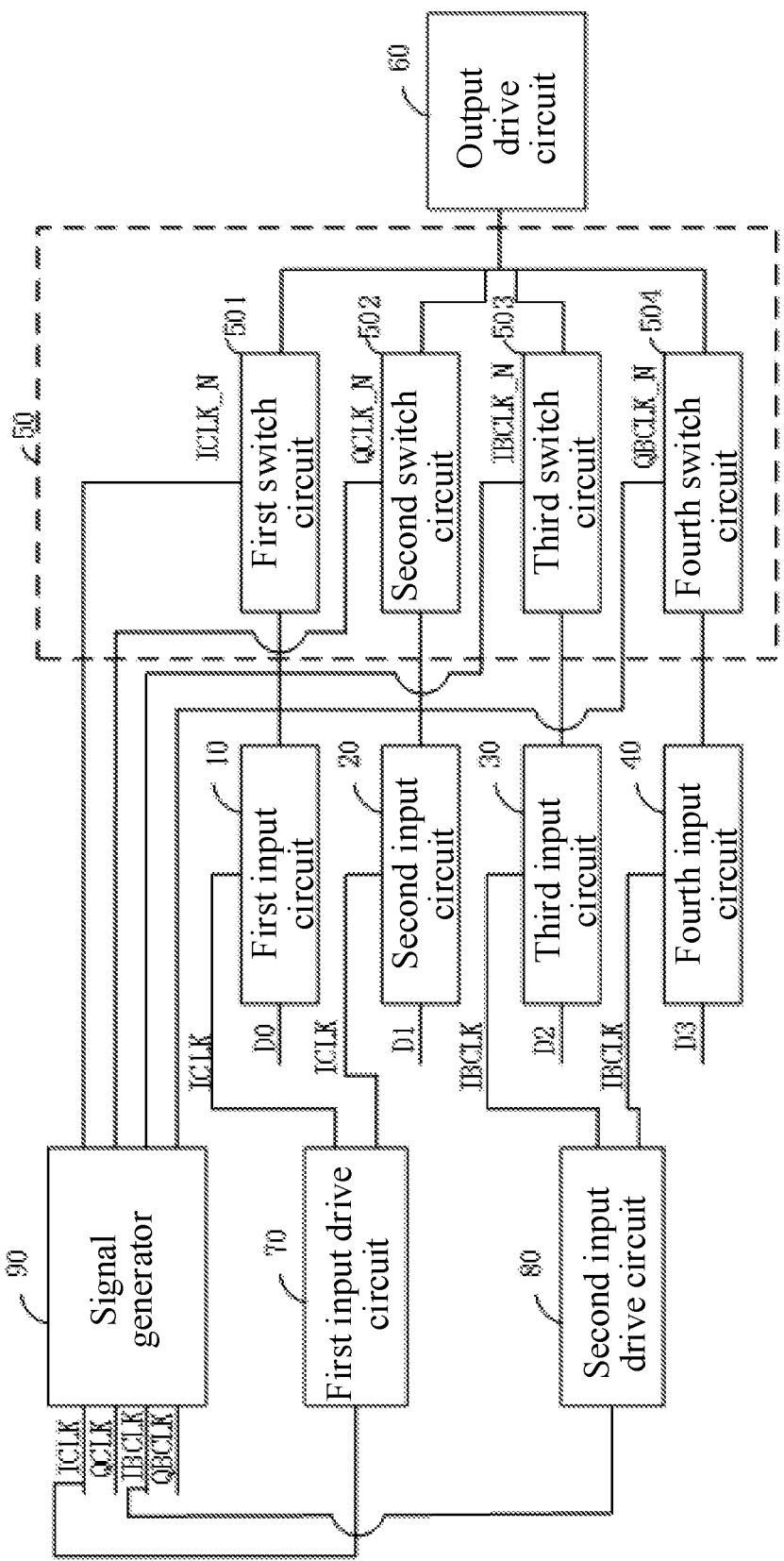
FIG. 4 is a schematic circuit diagram of a data synthesizer according to yet another embodiment of the present disclosure.

As illustrated in FIG. 4, an embodiment of the present disclosure provides a data synthesizer. The data synthesizer includes a first input circuit 10, a second input circuit 20, a third input circuit 30, a fourth input circuit 40, and an output circuit 50.

The output circuit 50 includes a first switch circuit 501, a second switch circuit 502, a third switch circuit 503, and a fourth switch circuit 504. The first switch circuit 501 is provided with a first terminal, a second terminal and a control terminal. The first terminal of the first switch circuit 501 is connected to an output terminal of the first input circuit 10, the second terminal of the first switch circuit 501 is taken as an output terminal of the output circuit 50, and the control terminal of the first switch circuit 501 is configured to receive a first output clock signal ICLK_N.

The second switch circuit 502 is provided with a first terminal, a second terminal and a control terminal. The first terminal of the second switch circuit 502 is connected to an output terminal of the second input circuit 20, the second terminal of the second switch circuit 502 is connected to the second terminal of the first switch circuit 501, and the control terminal of the second switch circuit 502 is configured to receive a second output clock signal QCLK_N.

The third switch circuit 503 is provided with a first terminal, a second terminal and a control terminal. The first terminal of the third switch circuit 503 is connected to an output terminal of the third input circuit 30, the second terminal of the third switch circuit 503 is connected to the second terminal of the first switch circuit 501, and the control terminal of the third switch circuit 503 is configured to receive a third output clock signal IBCLK_N.

The fourth switch circuit 504 is provided with a first terminal, a second terminal and a control terminal. The first terminal of the fourth switch circuit 504 is connected to an output terminal of the fourth input circuit, the second terminal of the fourth switch circuit 504 is connected to the second terminal of the first switch circuit 501, and the control terminal of the fourth switch circuit 504 is configured to receive a fourth output clock signal QBCLK_N.

Phases of the first output clock signal ICLK_N, the second output clock signal QCLK_N, the third output clock signal IBCLK_N, and the fourth output clock signal QBCLK_N are all different. The first switch circuit 501 is configured to output, through the second terminal of the first switch circuit 501, first data D0 under control of the first output clock signal ICLK_N. The second switch circuit 502 is configured to output, through the second terminal of second switch circuit 502, second data D1 under control of the second output clock signal QCLK_N. The third switch circuit 503 is configured to output, through the second terminal of third switch circuit 503, third data D2 under control of the third output clock signal IBCLK_N. The fourth switch circuit 504 is configured to output, through the second terminal of the fourth switch circuit 504, fourth data D3 under control of the fourth output clock signal QBCLK_N.

The first data D0 and the second data D1 arrive at the same time. When the first latch clock signal ICLK arrives, the first input circuit 10 outputs the first data D0 and simultaneously, the second input circuit 20 outputs the second data D1. After the first data D0 and the second data D1 arrive, the third data D2 and the fourth data D3 arrive at the same time. When the second latch clock signal IBCLK arrives, the third input circuit 30 outputs the third data D2 and simultaneously, the fourth input circuit 40 outputs the fourth data D3. The first switch circuit 501 receives the first data D0 and simultaneously, the second switch circuit 502 receives the second data D1, and moreover, the phase of the first output clock signal ICLK_N of the first switch circuit 501 is different from the phase of the second output clock signal QCLK_N of the second switch circuit 502, so that the first data D0 and the second data D1 can be output in sequence. After the first switch circuit 501 receives the first data D0 and the second switch circuit 502 receives the second data D1, the third switch circuit 503 receives the third data D2 and simultaneously, the fourth switch circuit 504 receives the fourth data D3, and moreover, the phase of the third output clock signal IBCLK_N of the third switch circuit 503 is different from the phase of the fourth output clock signal QBCLK_N of the fourth switch circuit 504, so that the third data D2 and the fourth data D3 can be output in sequence. In addition, since a time at which the first switch circuit 501 receives the first data D0 and a time at which the second switch circuit 502 receives the second data D1 are both earlier than a time at which the third switch circuit 503 receives the third data D2 and a time at which the fourth switch circuit 504 receives the fourth data D3, so that the output timing of the first data D0, the second data D1, the third data D2 and the fourth data D3 is controlled, thereby the first data D0, the second data D1, the third data D2 and the fourth data D3 can be output in sequence.

In the above technical solution, four switch circuits are provided in the output circuit 50, each switch circuit is connected to a respective one of input circuits, and each input circuit outputs corresponding data under the control of a latch clock signal. A phase of the data at an input terminal of the first input circuit 10 is the same as a phase of the data at an input terminal of the second input circuit 20, and a phase of the latch clock signal of the first input circuit 10 is set to be the same as a phase of the latch clock signal of the second input circuit 20, so as to ensure that the latch clock signal is located in the middle of the hold time period of the corresponding data. Thus, even when the phase fluctuation occurs at the data or the latch clock signal, the data can still be set up at the output terminals of the two input circuits as early as possible and the hold time of the data can be lengthened. A phase of the data at an input terminal of the third input circuit 30 is the same as a phase of the data at an input terminal of the fourth input circuit 40, and a phase of the latch clock signal of the third input circuit 30 is set to be the same as a phase of the latch clock signal of the fourth input circuit 40, so as to ensure that the latch clock signal is located in the middle of the hold time period of the corresponding data. Thus, even when the phase fluctuation occurs at the data or the latch clock signal, the data can still be set up at the output terminals of the two input circuits as early as possible and the hold time of the data can be lengthened. Further, four switch circuits with the output clock signals of different phases are provided to control the output timing of the four channels of data, so as to synthesize the four channels of data into one channel of data for outputting. With such a configuration, the accuracy of synthesizing four channels of data into one channel of data can be improved.

In an embodiment, the phase of the first output clock signal ICLK_N is ahead of the phase of the second output clock signal QCLK_N by 90°, the phase of the second output clock signal QCLK_N is ahead of the phase of the third output clock signal IBCLK_N by 90°, and the phase of the third output clock signal IBCLK_N is ahead of the phase of the fourth output clock signal QBCLK_N by 90°. With such a configuration, the data outputted from the four input circuits are output in sequence, so that the four channels of data are synthesized into one channel of data for outputting.

In an embodiment, a time corresponding to a rising edge of the first latch clock signal ICLK is earlier than a time corresponding to a rising edge of the first output clock signal ICLK_N, and a time corresponding to a falling edge of the first latch clock signal ICLK is later than a time corresponding to a falling edge of the second output clock signal QCLK_N. With such a configuration, both the time period corresponding to the first output clock signal ICLK_N and the time period corresponding to the second output clock signal QCLK_N can be allowed to be located within the time period corresponding to the first latch clock signal ICLK, and the first switch circuit 501 and the second switch circuit 502 can accurately output the first data D0 and the second data D1 in sequence.

In an embodiment, a time corresponding to a rising edge of the second latch clock signal IBCLK is earlier than a time corresponding to a rising edge of the third output clock signal IBCLK_N, and a time corresponding to a falling edge of the second latch clock signal IBCLK is later than a time corresponding to a falling edge of the fourth output clock signal QBCLK_N. With such a configuration, both the time period corresponding to the third output clock signal IBCLK_N and the time period corresponding to the fourth output clock signal QBCLK_N can be allowed to be located within the time period corresponding to the second latch clock signal IBCLK, and the third switch circuit 503 and the fourth switch circuit 504 can accurately output the third data D2 and the fourth data D3 in sequence.

In an embodiment, the first switch circuit 501, the second switch circuit 502, the third switch circuit 503 and the fourth switch circuit 504 are all transistors. A first terminal of each transistor is the first terminal of the corresponding switch circuit, a second terminal of each transistor is the second terminal of the corresponding switch circuit, and a control terminal of each transistor is the control terminal of the corresponding switch circuit.

For example, if the first switch circuit 501, the second switch circuit 502, the third switch circuit 503, and the fourth switch circuit 504 are all metal oxide semiconductor (MOS) transistors, a source of each MOS transistor is the first terminal of the corresponding switch circuit, a drain of each MOS transistor is the second terminal of the corresponding switch circuit, and a gate of each MOS transistor is the control terminal of the corresponding switch circuit.

In an embodiment, with continued reference to FIG. 4, the data synthesizer further includes a first input drive circuit 70, a second input drive circuit 80, and an output drive circuit 60.

The first input drive circuit 70 is provided with an input terminal and an output terminal. The input terminal of the first input drive circuit 70 is configured to receive a first latch clock signal ICLK, the output terminal of the first input drive circuit 70 is connected to the first input circuit 10, and the output terminal of the first input drive circuit 70 is further connected to the second input circuit 20. The first input drive circuit 70 is configured to perform enhancement processing on the first latch clock signal ICLK.

The second input drive circuit 80 is provided with an input terminal and an output terminal. The input terminal of the second input drive circuit 80 is configured to receive a second latch clock signal IBCLK, the output terminal of the second input drive circuit 80 is connected to the third input circuit 30, and the output terminal of the second input drive circuit 80 is further connected to the fourth input circuit 40. The second input drive circuit 80 is configured to perform enhancement processing on the second latch clock signal IBCLK.

The output drive circuit 60 is provided with an input terminal, and the input terminal of the output drive circuit 60 is connected to the output terminal of the output circuit 50. The output drive circuit is configured to perform enhancement processing on the first data D0, the second data D1, the third data D2, and the fourth data D3.

In the above technical solution, by configuring two input drive circuits to enhance the steepness of the rising edges or falling edges of the two latch clock signals, the four input circuits can be allowed to quickly output the corresponding data when the corresponding latch clock signals arrives, so that the setup time for the data to be set up at the output terminals of the input circuits is advanced, and the hold time of the data is lengthened, thereby improving the accuracy of data synthesis.

In an embodiment, with continued reference to FIG. 4, the data synthesizer further includes a signal generator 90. The signal generator 90 is provided with input terminals, a first output terminal, a second output terminal, a third output terminal, and a fourth output terminal.

The first output terminal of the signal generator 90 is connected to the control terminal of the first switch circuit 501, the second output terminal of the signal generator 90 is connected to the control terminal of the second switch circuit 502, the third output terminal of the signal generator 90 is connected to the control terminal of the third switch circuit 503, and the fourth output terminal of the signal generator 90 is connected to the control terminal of the fourth switch circuit 504.

The signal generator 90 receives, through the input terminals of the signal generator 90, the first latch clock signal ICLK, the second latch clock signal IBCLK, the third latch clock signal QCLK, and the fourth latch clock signal QBCLK, and then generates the first output clock signal ICLK_N according to the first latch clock signal ICLK, generates the second output clock signal QCLK_N according to the third latch clock signal QCLK, generates the third output clock signal IBCLK_N according to the second latch clock signal IBCLK, and generates the fourth output clock signal QBCLK_N according to the fourth latch clock signal QBCLK.

Figure 5:
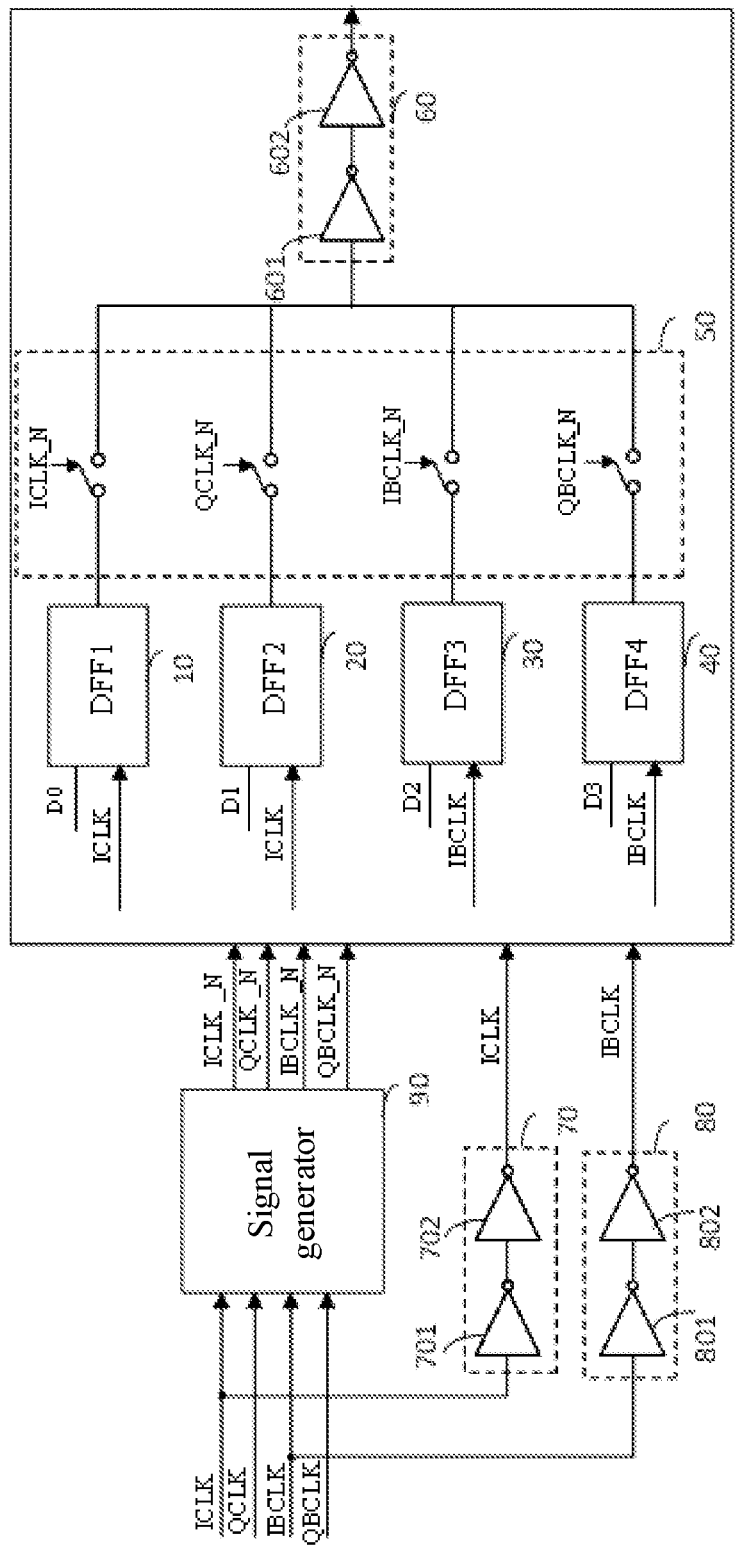
FIG. 5 is a schematic circuit diagram of a data synthesizer according to still another embodiment of the present disclosure.

As illustrated in FIG. 5, an embodiment of the present disclosure provides a data synthesizer. The data synthesizer includes a first input circuit 10, a second input circuit 20, a third input circuit 30, a fourth input circuit 40, and an output circuit 50.

The first input circuit 10, the second input circuit 20, the third input circuit 30, and the fourth input circuit 40 are all D-type data flip-flops, and are sequentially labeled as a first data flip-flop DFF1, a second data flip-flop DFF2, a third data flip-flop DFF3, and a fourth data flip-flop DFF4. The output circuit 50 includes the first switch circuit 501, the second switch circuit 502, the third switch circuit 503, and the fourth switch circuit 504.

An output terminal of the first data flip-flop DFF1 is connected to the first terminal of the first switch circuit 501, an output terminal of the second data flip-flop DFF2 is connected to the first terminal of the second switch circuit 502, an output terminal of the third data flip-flop DFF3 is connected to the first terminal of the third switch circuit 503, and an output terminal of the fourth data flip-flop DFF4 is connected to the first terminal of the fourth switch circuit 504.

A latch clock signal of the first data flip-flop DFF1 is a first latch clock signal ICLK, a latch clock signal of the second data flip-flop DFF2 is the first latch clock signal ICLK, a latch clock signal of the third data flip-flop DFF3 is a second latch clock signal IBCLK, and a latch clock signal of the fourth data flip-flop DFF4 is the second latch clock signal IBCLK.

The control terminal of the first switch circuit 501 receives a first output clock signal ICLK_N, the control terminal of the second switch circuit 502 receives a second output clock signal QCLK_N, the control terminal of the third switch circuit 503 receives a third output clock signal IBCLK_N, and the control terminal of the fourth switch circuit 504 receives a fourth output clock signal QBCLK_N.

The data synthesizer further includes an output drive circuit 60, and an input terminal of the output drive circuit 60 is connected to an output terminal of the output circuit 50. The output drive circuit 60 includes a first output inverter 601 and a second output inverter 602 which are cascaded, an input terminal of the first output inverter 601 is the input terminal of the output drive circuit 60, and an output terminal of the second output inverter 602 is an output terminal of the output drive circuit 60. The inverting processing is performed on data output from the output circuit 50 twice, so as to enhance the data output from the output circuit 50.

The data synthesizer further includes a first input drive circuit 70 and a second input drive circuit 80. An output terminal of the first input drive circuit 70 is connected to the first input circuit 10, and the output terminal of the first input drive circuit 70 is further connected to the second input circuit 20. The first input drive circuit includes a first input inverter 701 and a second input inverter 702 which are cascaded. An input terminal of the first input inverter 701 is an input terminal of the first input drive circuit 70. The input terminal of the first input inverter 701 is configured to receive the first latch clock signal ICLK. An output terminal of the second input inverter 702 is the output terminal of the first input drive circuit 70.

An output terminal of the second input drive circuit 80 is connected to the third input circuit 30, and the output terminal of the second input drive circuit 80 is further connected to the fourth input circuit 40. The second input drive circuit 80 includes a third input inverter 801 and a fourth input inverter 802 which are cascaded. An input terminal of the third input inverter 801 is an input terminal of the second input drive circuit 80. The input terminal of the third input inverter 801 is configured to receive the second latch clock signal IBCLK. An output terminal of the fourth input inverter 802 is the output terminal of the second input drive circuit 80.

Figure 6:
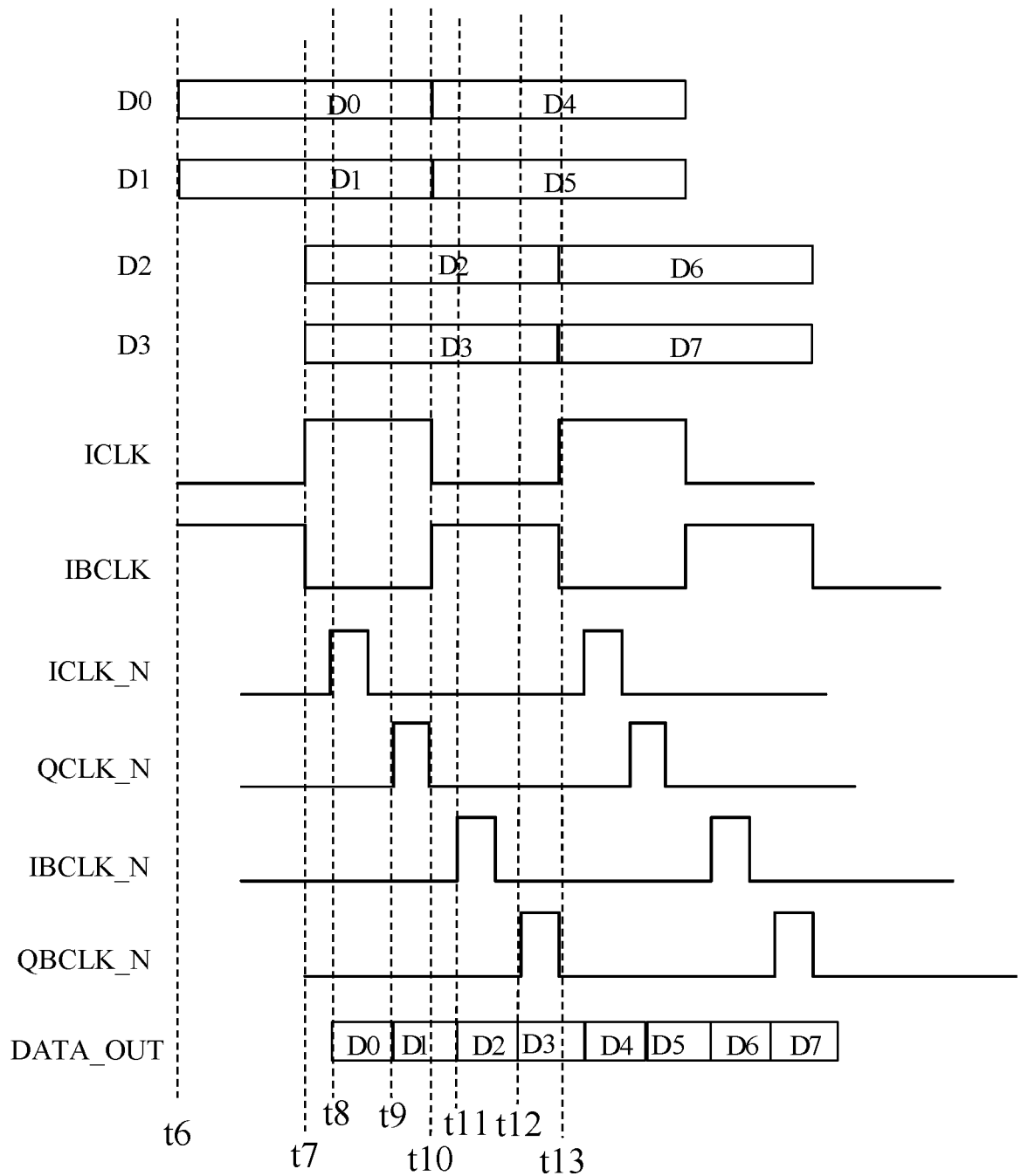
FIG. 6 is a timing diagram of the data synthesizer provided in the embodiment illustrated in FIG. 5.

The operation principle of the data synthesizer illustrated in FIG. 5 will be described below with reference to FIG. 6.

At time t6, the first data D0 arrives and is held until time t10, the first data flip-flop DFF1 latches the first data D0. At time t6, the second data D1 arrives and is held until time t10, and the second data flip-flop DFF2 latches the second data D1.

At time t7, that is, after the phases of the first data D0 and the second data D1 are delayed by 180°, the third data D2 arrives and is held until t13, and the third data flip-flop DFF3 latches the third data D2; and the fourth data D3 arrives and is held until t13, and the fourth data flip-flop DFF4 latches the fourth data D3. At time t7, the first latch clock signal ICLK arrives, the first data flip-flop DFF1 releases the first data D0, and the second data flip-flop DFF2 releases the second data D1.

At time t8, the first output clock signal ICLK_N arrives, and the first switch circuit 501 is turned on to output the first data D0. At time t9, the second output clock signal QCLK_N arrives, and the second switch circuit 502 is turned on to output the second data D1. The time t8 is later than the time t7, and the time t9 is earlier than the time t10.

At time t10, that is, after the phase of the first latch clock signal ICLK is delayed by 180°, the second latch clock signal IBCLK arrives, the third data flip-flop DFF3 releases the third data D2, and the fourth data flip-flop DFF4 releases the fourth data D3.

At time t11, the third output clock signal IBCLK_N arrives, and the third switch circuit 503 is turned on to output the third data D2. At time t12, the fourth output clock signal QBCLK_N arrives, and the fourth switch circuit 504 is turned on to output the fourth data D3. The time t10 is later than the time t9, and the time t11 is earlier than the time t12.

In the above-described timing relationship, at the time t6, the first data D0 and the second data D1 arrive at the same time; and the first data flip-flop and the second data flip-flop use the same latch clock signal. At the time t7, the first latch clock signal ICLK arrives, the first data flip-flop DFF1 outputs the first data D0, and at the same time, the second data flip-flop DFF2 outputs the second data D1. In such a manner, the latch clock signal of the first data flip-flop and the second data flip-flop can be located in the middle of the hold time period of the data, and the corresponding switch circuits are controlled by the two output clock signals with different phases, so that the first data D0 and the second data D1 can be output according to time division. Moreover, the same manner is applied to the third data D2 and the fourth data D3. For the two input circuits receiving the data with the same phase, the two input circuits use the same latch clock signal, so that each channel of data in the synthesized data can be ensured to have the earliest setup time and the maximum hold time. Because the phases of the four output clock signals are different, the output terminal DATA_OUT of the data synthesizer can output the first data D0, the second data D1, the third data D2, and the fourth data D3 in sequence, so as to synthesize the four channels of data into one channel of data for outputting.

Other embodiments of the present disclosure will be readily contemplated by those skilled in the art after considering the specification and practicing the invention disclosed herein. The present disclosure is intended to cover any variations, uses, or adaptations of the present disclosure which follow the general principles of the present disclosure and which include well-known common sense or customary technical means in the art that are not disclosed herein. The specification and embodiments are considered exemplary only, and the true scope and spirit of the present disclosure are indicated by the following claims.

It should be understood that the present disclosure is not limited to the precise structure already described above and illustrated in the appended drawings, and various modifications and changes may be made without departing from the scope of the present disclosure. The scope of the present disclosure is limited only by the appended claims.

The data synthesizer provided in the embodiments of the present disclosure includes a first input circuit, a second input circuit, and an output circuit. A latch clock signal of the first input circuit is the same as a latch clock signal of the second input circuit, and a phase of data at an input terminal of the first input circuit is the same as a phase of data at an input terminal of the second input circuit. By such a configuration, it can be ensured that the corresponding data is set up at output terminals of the two input circuits as early as possible, and the hold time of the data is lengthened. Input terminals of the output circuit are connected to the two input circuits. The output circuit is configured to control output timing of the received data, so as to synthesize two channels of data into one channel of data for outputting. That is to say, the solutions of the present disclosure can achieve the effect that each channel of data in the synthesized data can be ensured to have the best setup time and the best hold time.

What is claimed is:

1. A data synthesizer, comprising:
a first input circuit, configured to latch first data under control of a first latch clock signal;
a second input circuit, configured to latch second data under the control of the first latch clock signal, wherein a phase of the first data is the same as a phase of the second data; and
an output circuit, connected to the first input circuit and the second input circuit, and configured to output the first data and the second data in sequence, wherein the output circuit comprises:
a first switch circuit, having a first terminal, a second terminal and a control terminal, wherein the first terminal of the first switch circuit is connected to an output terminal of the first input circuit, the second terminal of the first switch circuit is taken as an output terminal of the output circuit, the control terminal of the first switch circuit is configured to receive a first output clock signal, and the first switch circuit is configured to output, through the second terminal of the first switch circuit, the first data under control of the first output clock signal; and
a second switch circuit, having a first terminal, a second terminal and a control terminal, wherein the first terminal of the second switch circuit is connected to an output terminal of the second input circuit, the second terminal of the second switch circuit is connected to the second terminal of the first switch circuit, the control terminal of the second switch circuit is configured to receive a second output clock signal, and the second switch circuit is configured to output, through the second terminal of the second switch circuit, the second data under control of the second output clock signal.

2. The data synthesizer of claim 1, further comprising:
a third input circuit, configured to latch third data under control of a second latch clock signal;
a fourth input circuit, configured to latch fourth data under the control of the second latch clock signal, wherein a phase of the third data is the same as a phase of the fourth data; and
the output circuit, being further connected to the third input circuit and the fourth input circuit, and being configured to output the first data, the second data, the third data and the fourth data in sequence.

3. The data synthesizer of claim 2, wherein a phase of the first latch clock signal is ahead of a phase of the second latch clock signal by 180°.

4. The data synthesizer of claim 3, wherein the phase of the first data is ahead of the phase of the third data by 180°, and a time corresponding to a rising edge of the first latch clock signal is the same as a time at which the third data is set up at an input terminal of the third input circuit.

5. The data synthesizer of claim 2, further comprising:
an output drive circuit, wherein an input terminal of the output drive circuit is connected to an output terminal of the output circuit, and the output drive circuit is configured to perform enhancement processing on the first data, the second data, the third data and the fourth data.

6. The data synthesizer of claim 5, wherein the output drive circuit comprises a first output inverter and a second output inverter that are cascaded; and
an input terminal of the first output inverter is the input terminal of the output drive circuit, and an output terminal of the second output inverter is an output terminal of the output drive circuit.

7. The data synthesizer of claim 2, further comprising:
a first input drive circuit, having an input terminal and an output terminal, wherein the input terminal of the first input drive circuit is configured to receive the first latch clock signal, the output terminal of the first input drive circuit is connected to the first input circuit and the second input circuit, and the first input drive circuit is configured to perform enhancement processing on the first latch clock signal; and
a second input drive circuit, having an input terminal and an output terminal, wherein the input terminal of the second input drive circuit is configured to receive the second latch clock signal, the output terminal of the second input drive circuit is connected to the third input circuit and the fourth input circuit, and the second input drive circuit is configured to perform enhancement processing on the second latch clock signal.

8. The data synthesizer of claim 7, wherein
the first input drive circuit comprises a first input inverter and a second input inverter that are cascaded, wherein an input terminal of the first input inverter is the input terminal of the first input drive circuit, and an output terminal of the second input inverter is the output terminal of the first input drive circuit; and
the second input drive circuit comprises a third input inverter and a fourth input inverter that are cascaded; wherein an input terminal of the third input inverter is the input terminal of the second input drive circuit, and an output terminal of the fourth input inverter is the output terminal of the second input drive circuit.

9. The data synthesizer of claim 2, wherein the first input circuit, the second input circuit, the third input circuit and the fourth input circuit are all data flip-flops.

10. The data synthesizer of claim 1, wherein the output circuit further comprises:
a third switch circuit, having a first terminal, a second terminal and a control terminal, wherein the first terminal of the third switch circuit is connected to an output terminal of a third input circuit, the second terminal of the third switch circuit is connected to the second terminal of the first switch circuit, the control terminal of the third switch circuit is configured to receive a third output clock signal, and the third switch circuit is configured to output, through the second terminal of the third switch circuit, third data under control of the third output clock signal; and
a fourth switch circuit, having a first terminal, a second terminal and a control terminal, wherein the first terminal of the fourth switch circuit is connected to an output terminal of a fourth input circuit, the second terminal of the fourth switch circuit is connected to the second terminal of the first switch circuit, the control terminal of the fourth switch circuit is configured to receive a fourth output clock signal, and the fourth switch circuit is configured to output, through the second terminal of the fourth switch circuit, fourth data under control of the fourth output clock signal.

11. The data synthesizer of claim 10, wherein a phase of the first output clock signal is ahead of a phase of the second output clock signal by 90°, the phase of the second output clock signal is ahead of a phase of the third output clock signal by 90°, and the phase of the third output clock signal is ahead of a phase of the fourth output clock signal by 90°.

12. The data synthesizer of claim 11, wherein a time corresponding to a rising edge of the first latch clock signal is earlier than a time corresponding to a rising edge of the first output clock signal, and a time corresponding to a falling edge of the first latch clock signal is later than a time corresponding to a falling edge of the second output clock signal.

13. The data synthesizer of claim 10, wherein the first switch circuit, the second switch circuit, the third switch circuit and the fourth switch circuit are all transistors.

14. The data synthesizer of claim 10, further comprising:
a signal generator, having input terminals, a first output terminal, a second output terminal, a third output terminal and a fourth output terminal,
wherein the input terminals of the signal generator are configured to receive the first latch clock signal, a second latch clock signal, a third latch clock signal and a fourth latch clock signal; and
the first output terminal of the signal generator is connected to the control terminal of the first switch circuit, the second output terminal of the signal generator is connected to the control terminal of the second switch circuit, the third output terminal of the signal generator is connected to the control terminal of the third switch circuit, and the fourth output terminal of the signal generator is connected to the control terminal of the fourth switch circuit;
wherein the signal generator is configured to generate the first output clock signal, the second output clock signal, the third output clock signal and the fourth output clock signal according to the first latch clock signal, the second latch clock signal, the third latch clock signal and the fourth latch clock signal; and
wherein a phase of the third latch clock signal is behind of a phase of the first latch clock signal by 90°, and a phase of the fourth latch clock signal is behind of a phase of the second latch clock signal by 90°.

* * * * *